United States Patent
Kusada et al.

(10) Patent No.: US 7,423,957 B2
(45) Date of Patent: Sep. 9, 2008

(54) OPTICAL INFORMATION RECORDING MEDIUM AND METHOD OF MANUFACTURING THEREOF, MANUFACTURING APPARATUS, RECORDING/REPRODUCING METHOD, AND RECORDING/REPRODUCING APPARATUS

(75) Inventors: Hideo Kusada, Osaka (JP); Ken'ichi Nagata, Nishinomiya (JP); Hideki Kitaura, Souraku-gun (JP); Kenichi Nishiuchi, Hirakata (JP); Noboru Yamada, Hirakata (JP); Rie Kojima, Kadoma (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 995 days.

(21) Appl. No.: 10/912,093

(22) Filed: Aug. 6, 2004

(65) Prior Publication Data
US 2005/0030882 A1   Feb. 10, 2005

(30) Foreign Application Priority Data
Aug. 7, 2003  (JP)  ............ P 2003-288505
Aug. 7, 2003  (JP)  ............ P 2003-288934

(51) Int. Cl.
*G11B 7/24* (2006.01)

(52) U.S. Cl. .......... 369/275.4; 369/283; 428/64.4; 204/192.32

(58) Field of Classification Search ... 369/275.1–275.5, 369/283, 288, 284, 280, 121, 272, 273, 286, 369/59.11; 428/64.1–64.5, 694 ML; 430/270.13; 204/192.32, 192.34, 192.35, 192.2
See application file for complete search history.

(56) References Cited

U.S. PATENT DOCUMENTS

| | | | | |
|---|---|---|---|---|
| 5,274,623 A | * | 12/1993 | Usami et al. | ............. 369/275.1 |
| 6,051,113 A | | 4/2000 | Moslehi | |
| 6,108,295 A | * | 8/2000 | Ohno et al. | ............. 369/275.2 |
| 6,180,208 B1 | * | 1/2001 | Shiratori et al. | ............. 428/141 |

(Continued)

FOREIGN PATENT DOCUMENTS

JP          2000-36130          2/2000

(Continued)

OTHER PUBLICATIONS

European Search Report (in English language) issued Aug. 16, 2007 in European Application No. 04 018 687.6-1232, which is a foreign counterpart to the present U.S. application.

*Primary Examiner*—Ali Neyzari
(74) *Attorney, Agent, or Firm*—Wenderoth, Lind & Ponack, L.L.P.

(57) ABSTRACT

The present invention provides an optical information recording medium of excellent signal quality in high density recording onto a semitransparent information layer, its manufacturing method and a manufacturing apparatus. The optical information recording medium of the present invention includes at least a semitransparent information layer disposed between a circular transparent substrate and a protective substrate, in which the information layer has spiral grooves for guiding a light beam, and also includes a recording film capable of recording/reproducing information thereon/therefrom by changing at least in two states detectable optically by irradiation of the light beam from the transparent substrate side, and the difference in film thickness of slope portions of the inner circumferential side and outer circumferential side of the groove is within ±10% in the entire region for recording/reproducing information.

27 Claims, 6 Drawing Sheets

U.S. PATENT DOCUMENTS

| | | |
|---|---|---|
| 6,241,857 B1 | 6/2001 | Yamada |
| 6,456,584 B1 | 9/2002 | Nagata et al. |
| 6,554,974 B2 * | 4/2003 | Shiratori ................ 204/192.32 |
| 7,280,462 B2 * | 10/2007 | Ohkubo ................... 369/275.4 |
| 2006/0146685 A1 * | 7/2006 | Nagata et al. ............ 369/275.1 |

FOREIGN PATENT DOCUMENTS

| | | |
|---|---|---|
| JP | 2000-242970 | 9/2000 |
| JP | 2002-279703 | 9/2002 |
| WO | 03/036633 | 5/2003 |

* cited by examiner

OPTICAL INFORMATION RECORDING MEDIUM AND METHOD OF MANUFACTURING THEREOF, MANUFACTURING APPARATUS, RECORDING/REPRODUCING METHOD, AND RECORDING/REPRODUCING APPARATUS

BACKGROUND OF THE INVENTION

1. Field of the Invention

The present invention relates to an optical information recording medium capable of recording/reproducing information signals by irradiating high energy light beam such as laser onto a thin film formed on a substrate, its manufacturing method, a manufacturing apparatus, a recording/reproducing method, and a recording/reproducing apparatus.

2. Description of the Related Art

Research and development are intensive about optical information recording media for irradiating laser beam onto the medium formed by laminating thin films on a plane of a substrate preliminarily forming grooves for guiding laser beam to heat locally, changing in optically detectable two or more states formed by the different light irradiating conditions, and recording information by corresponding this change to the information signal. Basic means for increasing the quantity of information to be accumulated per piece of optical information recording medium includes a method of enhancing the recording plane density by reducing the spot diameter of laser beam by shortening the wavelength of laser beam or increasing the numerical aperture of the objective lens for focusing it.

The recent main stream is the use of optical system of wavelength of 660 nm and numerical aperture of about 0.6 as represented by a recordable DVD. It has been further studied to enhance the numerical aperture to about 0.85 by using a blue laser diode near wavelength of 400 nm which is presently in a practical stage. By heightening the numerical aperture, the allowable width to tilting of optical disc becomes smaller; hence, it has been also proposed to reduce the thickness of transparent substrate at the laser beam incident side from 0.6 mm of recordable DVD to about 0.1 mm.

Further, in order to increase the quantity of information accumulated per medium, there has been proposed to laminate a plurality of layers for recording/reproducing information as multilayer structural medium (for example, see JP-A 2000-36130, pp. 7-8, FIG. 1). In a multilayer recording medium, an information layer near the laser light source absorbs light, and an information layer remote from the laser light source records/reproduces information by an attenuated laser beam. Accordingly, in the multilayer recording medium, the information layer near the laser light source is higher in transmissivity, and the information layer remote from the laser light source is higher in reflectivity, reflectivity difference and sensitivity, so that a sufficient recording/reproducing characteristic may be obtained by a limited laser power.

SUMMARY OF THE INVENTION

In a conventional multilayer recording medium, however, in the information laser near the laser light source, the noise level after recording in the outer circumference of the disc, in particular, is worsened the in inner or intermediate circumference, as disclosed by the experiment by the present inventors. The section of this disc was observed by transmission electron microscope, and the groove shape was almost symmetrical to the center of groove and was free from problem in the whole range from the inner circumference to the outer circumference of the disc, but in the outer circumference of the disc, the film thickness of the information layer was obviously different, for example, by about 20 percent between the inner circumferential slope and the outer circumferential slope of the groove.

The causative relation of film thickness difference and high noise level may be explained from a thermal aspect and an optical aspect as follows. If there is a difference in film thickness between the inner circumferential slope and the outer circumferential slope of the groove, a difference is caused in diffusion speed of heat due to difference in thermal capacity of the two, and the mark shape is distorted, not symmetrical to the track center, and the noise level is elevated. At the same time, between the inner circumferential slope and the outer circumferential slope of the groove, a difference is caused in the optical characteristics such as reflectivity to a laser beam, and the spot center of the laser beam is deviated from the track center, and normal tracking motion is out of order, and as a result of recording motion in such state, the noise level is raised.

Existing recording media are mostly recording media having a single information layer only, not multilayer recording media, and the information layer is not required to pass a laser beam, and, for example, if the reflection film is formed in a sufficient thickness until the transmissivity is almost zero, and there is a difference in film thickness between the inner circumferential slope and the outer circumferential slope of the groove, the thermal or optical characteristic difference of the two may be regarded to be small enough to be ignored.

By contrast, in the multilayer recording medium, the information layer near the laser light source is required to have a certain transmissivity, for example, 30% or more, and unlike the recording media having a single information layer only or the information layer remote from the laser light source, its thermal or optical characteristic is considered to be very sensitive to difference in film thickness.

Almost all those skilled in the art are manufacturing thin films constructing information layers by a sputtering method having the substrate opposite to the target, and the present inventors also formed the films in the same method in the experiment. It is hard to employ other methods from the viewpoint of ease and practical use of a film forming apparatus or film forming speed. Usually, recording by a laser beam is performed by forming marks in grooves and/or flat portions between grooves, and the film forming apparatus is designed to keep a uniform film thickness in flat portions from the inner circumference to the outer circumference of the disc. In the slope portion of the groove, however, the angle and speed of particles flying from the target, that is, the film raw material by sputtering are not uniform from the inner circumference to the outer circumference of the disc, and the film thickness may differ in some parts between the inner circumferential slope and the outer circumferential slope due to shadowing effects. So far, the groove slope has been considered to be indifferent to recording/reproducing characteristic because mark is not formed, and nothing has been considered in designing of the film forming apparatus about precise and uniform film thickness between the inner circumferential slope and the outer circumferential slope from the inner circumference to the outer circumference of the disc.

The present inventors found conditions for minimizing the film thickness difference between the slope of the inner circumference and the slope of the outer circumference of the disc by adjusting the distance between the target and the substrate installed in the film forming chamber, and also found that the film thickness difference can be narrowed generally by shortening the distance between the target and the substrate. However, if the distance between the target and the substrate is shortened in the film forming chamber for forming an information layer of a long sputtering time, the disc substrate temperature becomes higher, and the grooves formed in the substrate may be deformed. Depending on the target material, moreover, if the distance between the target and substrate is shortened, as the target is being used, the film thickness distribution is worsened in a relatively early period, and the target life may be shortened.

The present invention is devised to solve these problems, and it is an object thereof to provide an optical information recording medium of excellent signal quality even in high density recording in a semitransparent information layer, and its manufacturing method and manufacturing apparatus.

To solve the problems, the optical information recording medium of the present invention comprises at least a semi-transparent information layer disposed between a circular transparent substrate and a protective substrate, in which the information layer has spiral grooves for guiding a light beam and, also, includes a recording film capable of recording/reproducing information thereon/therefrom by changing at least in optically detectable two states formed by irradiation of the light beam from the transparent substrate side, and the difference in film thickness of slope portions of the inner circumferential side and the outer circumferential side of the groove is within ±10% in the entire region for recording/reproducing information.

In the optical information recording medium, preferably, one layer or two or more layers of additional information layers are disposed between the information layer and a protective substrate, and separation layers are disposed between the information layer and additional information layer, and between the respective additional information layers. At least the first information layer at the transparent substrate side out of the plurality of information layers is preferably within ±10% in the difference in film thickness of slope portions of the inner circumferential side and the outer circumferential side of the groove in the entire region for recording/reproducing information. Herein, the separation layer is a layer provided for sensing each information layer optically.

Preferably, in the optical information recording medium, the information layer has a first dielectric film at the transparent substrate side of the recording film. The dielectric film is provided for the purpose of preventing evaporation of a recording film and thermal deformation of a substrate in repeated processes of recording, and enhancing the light absorption rate and optical changes of the recording film by an optical interference effect, and is made of a dielectric material excellent in heat resistance.

Preferably, in the optical information recording medium, the information layer has a first interface film in contact with the interface at the protective substrate side of the recording film. The interface film is provided in contact with the recording film for the purpose of promoting crystallization of the recording film, enhancing the erasing characteristic, preventing mutual diffusion of atoms and molecules between the recording film and the dielectric film, and enhancing the durability in repeated recording operations.

Preferably, in the optical information recording medium, the information layer is a multilayer film having a second dielectric film at the protective substrate side of the recording film.

Preferably, in the optical information recording medium, the information layer has a reflection film at the protective substrate side of the recording film. The reflection film is provided for the purpose of using the incident light efficiently, enhancing the cooling speed of the recording film, and making easier to render amorphous, and is composed of metal and its alloy.

Preferably, in the optical information recording medium, the information layer has a transmissivity adjusting film at the protective substrate side of the reflection film. The transmissivity adjusting film is provided for the purpose of enhancing the transmissivity while keeping high the reflectivity change of the first information layer in the multilayer recording medium, and is generally composed of an almost transparent material high in refractive index.

Preferably, in the optical information recording medium, the information layer has a second interface film in contact with the interface at the transparent substrate side of the recording film.

The manufacturing method of an optical information recording medium of the present invention is a manufacturing method of an optical information recording medium comprising: sequentially forming a plurality of information layers having spiral grooves for guiding a light beam on a substrate, in a plurality of film forming chambers having oppositely disposed targets and substrate holders, in which the distance between the substrate and the film material target in any one film forming chamber out of the plurality of film forming chambers is set different from the distance between the substrate and the film material target in the remaining film forming chambers, and the difference in film thickness of slope portions of the inner circumferential side and the outer circumferential side of the groove is within ±10%. The optical information recording medium may have one layer or two or more layers of additional information layers, disposed between a first information layer as the information layer and a protective substrate and have separation layers disposed between the first information layer and the additional information layer, and between the respective additional information layers, and the distance between the substrate and film material target in any one film forming chamber out of the plurality of film forming chambers may be set different from the distance between the substrate and the film material target in the remaining film forming chambers, thereby forming the first information layer.

The manufacturing apparatus of an optical information recording medium of the present invention is a manufacturing apparatus of an optical information recording medium having a plurality of information layers formed on a substrate, comprising:

at least two or more DC sputtering film forming chambers, each including an electrode, a magnetic field generating member for generating an electric field in the vicinity of the electrode, a target disposed on the electrode and made of a material corresponding to one information layer, and a substrate holder disposed separately opposite to the target;

at least two or more RF sputtering film forming chambers, each including an electrode, a magnetic field generating member for generating an electric field in the vicinity of the electrode, a target disposed on the electrode and made of a material corresponding to one information layer, and a substrate holder disposed separately opposite to the target; and a substrate conveying member for moving each substrate holder, conveying the optical disc substrate mounted on the substrate holder into each film forming chamber, and forming films sequentially, wherein the distance between electrode and substrate holder in each DC sputtering film forming chamber is respectively $Hd1$, $Hd2, \ldots, Hdm$ (where m is the number of DC sputtering film forming chambers), the distance between electrode and substrate holder in each RF sputtering film forming chamber is respectively Hr1, Hr2, ..., Hrn (where n is the number of RF sputtering film forming chambers), and any one of the distances Hd1, Hd2, ..., Hdm is set different from the other distances.

In another manufacturing apparatus of the present invention, relating to the same manufacturing apparatus, any one of the distances Hr1, Hr2, ..., Hrn is set different from any one of the distances Hd1, Hd2, ..., Hdm.

The manufacturing apparatus of the present invention is intended to solve the problems by designing the distance between the substrate holder and the electrode different individually in the plurality of vacuum film forming chambers. More specifically, in the film forming chamber for forming a material likely to damage the substrate by the radiant heat from the target, preferably, the distance from the substrate holder to the electrode should be set preliminarily long, and further in the film forming chamber for sputtering the target material likely to spoil the uniformity of film thickness distribution by shortening the distance between the electrode and the target, it is also preferred to keep the distance between the substrate holder and the electrode longer preliminarily. In other film forming chambers, on the other hand, by setting the distance between the substrate holder and the electrode shorter preliminarily, both mass producibility and characteristics of the optical disc medium can be satisfied.

Hitherto, in film forming chambers different in type of electric power to be applied to a target (for example, RF power and DC power), it is well-known to design the distance differently between the electrode and the cathode, and the reason is that the electrode for DC sputtering can be lowered in the radiant heat because it sputters a material of relatively high electric conductivity, that is, a material of high heat conductivity, and it is easier to set shorter the distance between the electrode and the substrate, but in the electrode for RF sputtering, since a material of relatively low electric conductivity is sputtered, the radiant heat is high, and it is hard to shorten the distance between the electrode and the substrate as compared with the case of DC electrode.

Hitherto, nothing has been known about the manufacturing apparatus of an optical disc medium, as in the present invention, designing differently in the distance between the electrode and the substrate holder in the film forming chambers using the same type of power source, by noticing the difference in the film thickness of the inner circumferential side and film thickness of the outer circumferential side formed on the slopes of the inner circumference and the outer circumference of the substrate. In the conventional manufacturing apparatus, it is not easy to modify to differ in the distance between the electrode and the substrate holder in plural film forming chambers using the same type of power source.

Meanwhile, it is possible, to a certain extent, to vary the distance between the target and the substrate by changing the plate thickness of the target so as to decrease the difference of the film thickness of the inner circumferential side and the film thickness of the outer circumferential side formed on the slopes of the inner circumference and the outer circumference of the substrate, but it is hard to obtain the outstanding effect as shown in the present invention. If the target plate thickness is large, it is hard to keep uniform the film thickness distribution of the disc from the beginning to end of use of the target, or if the target plate thickness is small, the period of use is short and mass producibility is poor.

It is also possible, to a certain extent, to vary the thickness of the conductive backing plate so as to decrease the difference of the film thickness of the inner circumferential side and the film thickness of the outer circumferential side formed on the slopes of the inner circumference and the outer circumference of the substrate, but it is hard to obtain the outstanding effect as shown in the present invention. If the backing plate thickness is large, it is hard to change the target because of its weight increase, or if the backing plate thickness is small, the target is easy to crack because of the thermal stress in sputtering.

The recording/reproducing method of an optical information recording medium of the present invention comprises: recording/reproducing information on/from an optical information recording medium comprising at least a semitransparent information layer disposed between a circular transparent substrate and a protective substrate, in which the information layer has spiral grooves for guiding a light beam and, also, includes a recording film capable of recording/reproducing information thereon/therefrom by changing at least in two states detectable optically by irradiation of the light beam from the transparent substrate side, and the difference in film thickness of slope portions of the inner circumferential side and the outer circumferential side of the groove is within ±10% in the entire region for recording/reproducing information, by using an optical system of a wavelength of 350 nm or more to 500 nm or less and a lens numerical aperture of 0.6 or more.

The recording/reproducing apparatus of an optical information recording medium of the present invention comprises an optical system of a wavelength of 350 nm or more to 500 nm or less and a lens numerical aperture of 0.6 or more for recording/reproducing information, for an optical information recording medium comprising at least a semitransparent information layer disposed between a circular transparent substrate and a protective substrate, in which the information layer has spiral grooves for guiding a light beam and, also, includes a recording film capable of recording/reproducing information thereon/therefrom by changing at least in two states detectable optically by irradiation of the light beam from the transparent substrate side, and the difference in film thickness of slope portions of the inner circumferential side and the outer circumferential side of the groove is within ±10% in the entire region for recording/reproducing information.

As described above, the present invention can provide an optical information recording medium of excellent signal quality, not high in noise level even in high density recording in a semitransparent information layer, and its manufacturing method, manufacturing apparatus, recording/reproducing method and recording/reproducing apparatus.

DETAILED DESCRIPTION OF THE PREFERRED EMBODIMENTS

Figure 1:
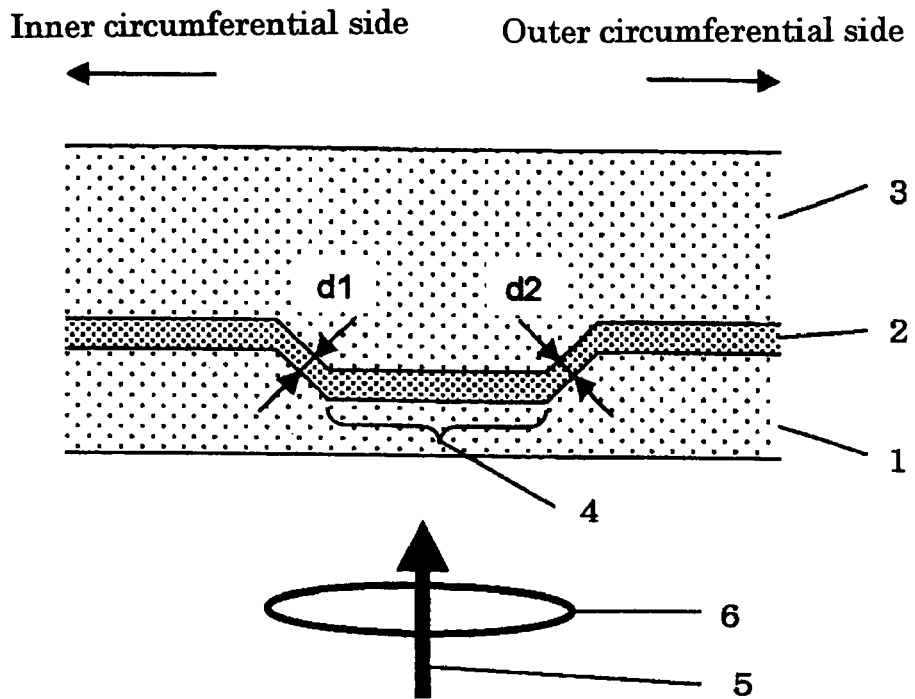
FIG. 1 is a sectional view of a structural example of an optical information recording medium of the present invention.

Referring now to the drawings, preferred embodiments of the present invention will be specifically described below.

(Optical Information Recording Medium)

FIG. 1 is a partial sectional view of a minimum structure of an optical information recording medium of the present invention. In FIG. 1, the optical information recording medium of the present invention has a semitransparent first information layer 2 disposed between a circular transparent substrate 1 and a protective substrate 3. Herein, "semitransparent" means transmissivity of at least 30% or more at a wavelength of a laser beam for recording/reproducing information. The first information layer 2 has a spiral groove 4 for guiding a laser beam, and information can be recorded thereon/reproduced therefrom by irradiation of a laser beam. Supposing the film thickness of the first information laser in the slope portions at the inner circumferential side and the outer circumferential side of the groove 4 to be d1 and d2, respectively, the difference is within ±10%, that is, $0.9 \leq (d2/d1) \leq 1.1$. In this optical information recording medium, a laser beam 5 is emitted from the side of the transparent substrate 1 by focusing by an objective lens 6, and information is recorded or reproduced.

Figure 2:
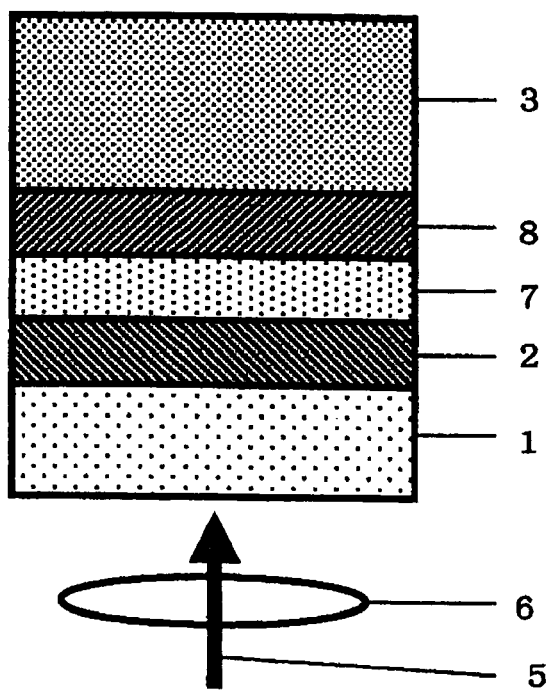
FIG. 2 is a sectional view of a structural example of the optical information recording medium of the present invention.
Figure 3:
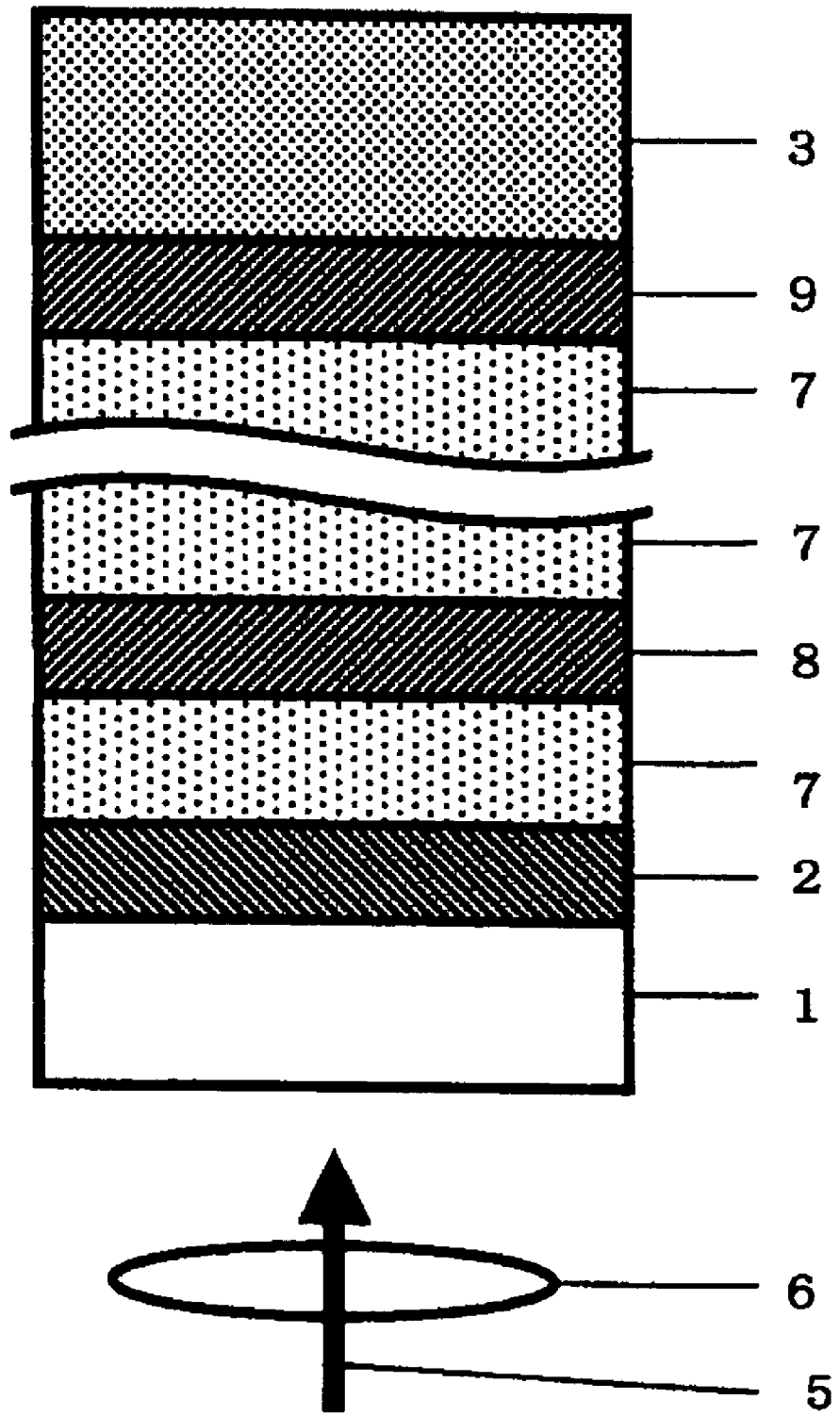
FIG. 3 is a sectional view of a structural example of the optical information recording medium of the present invention.
Figure 4:
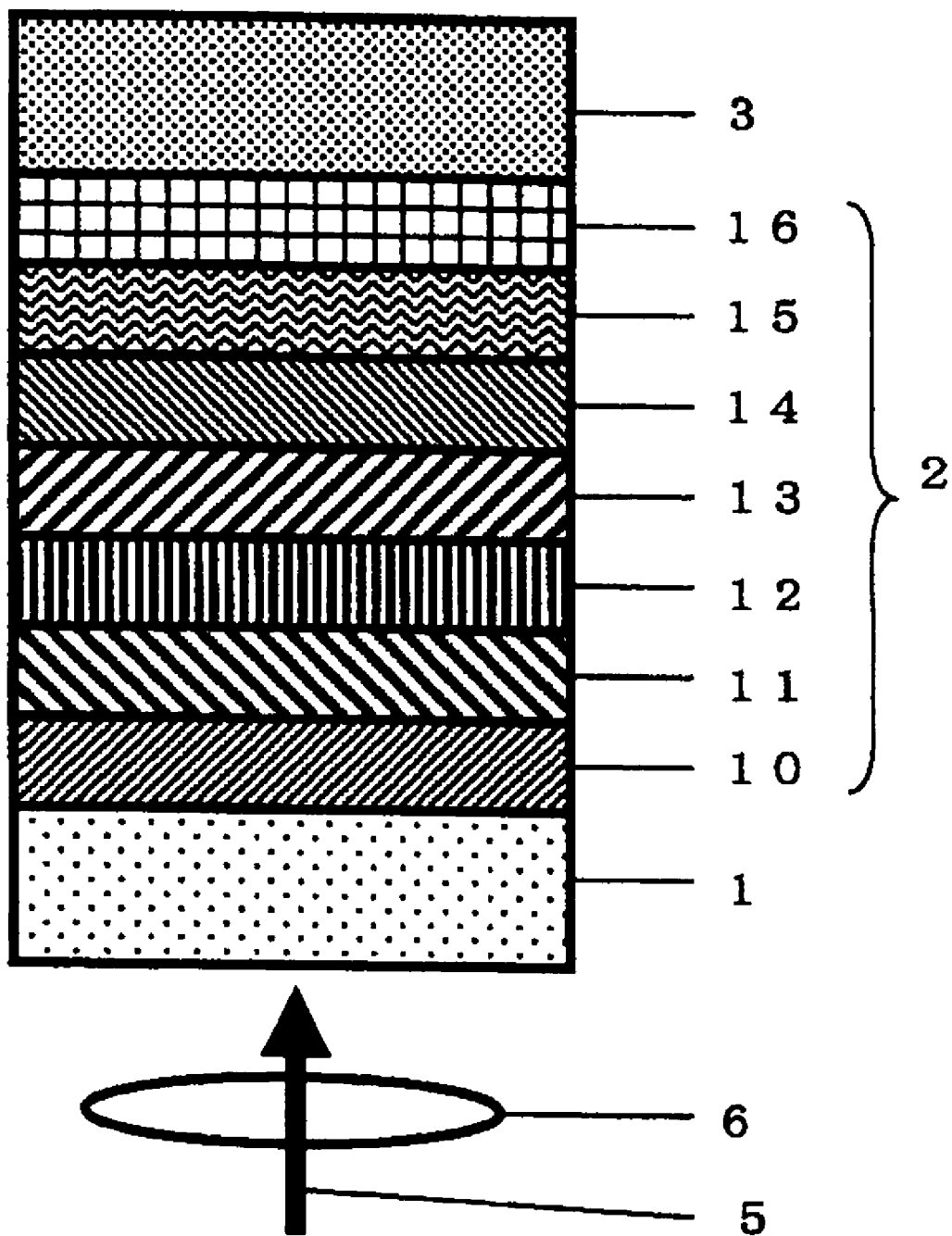
FIG. 4 is a sectional view of a structural example of the optical information recording medium of the present invention.

As shown in FIG. 2 and/or FIG. 3, the information layer includes not only the first information layer 2, but also additional information layers, such as a second information layer 8 and an n-th information layer 9 (where n is an integer of 3 or more), disposed between the first information layer 2 and the protective substrate 3, by way of a separation layer 7. FIG. 4 is a sectional view of an example of a multilayer structure of the first information layer 2. The first information layer 2 is composed by laminating a lower dielectric film 10, a lower interface film 11, a recording film 12, an upper interface film 13, an upper dielectric film 14, a reflection film 15, and a transmissivity adjusting film 16, sequentially from the side of the transparent substrate 1. Among them, the indispensable element for the first information layer 2 is the recording film 12, and others are used as required.

The material of the transparent substrate 1 is preferred to be almost transparent at the wavelength of the laser beam 5, and usable examples are polycarbonate resin, polymethyl methacrylate resin, polyolefin resin, norbornene resin, ultraviolet curing resin, glass, or their combinations. The thickness of the transparent substrate 1 is not particularly specified, but is preferably about 0.01 to 1.5 mm.

The lower dielectric film 10 and the upper dielectric film 14 are provided for the purpose of preventing evaporation of recording film or thermal deformation of substrate during repeated processes of recording, and further enhancing the light absorption rate and optical change of recording film by the optical interference effect, and dielectric materials excellent in heat resistance are used. Examples include oxides of Y, Ce, Ti, Zr, Nb, Ta, Co, Zn, Al, Si, Ge, Sn, Pb, Sb, Bi, Te and others, nitrides of Ti, Zr, Nb, Ta, Cr, Mo, W, B, Al, Ga, In, Si, Ge, Sn, Pb and others, carbides of Ti, Zr, Nb, Ta, Cr, Mo, Si and others, sulfides, selenides and tellurides of Zn, Cd and others, fluorides of rare earth elements of Mg, Ca, La and others, single elements of C, Si, Ge and others, or their mixtures. Above all, transparent and low heat conductivity materials are preferred, such as ZnS and $SiO_2$. The lower dielectric film 10 and the upper dielectric film 14 may be made of different materials and compositions, or same materials and compositions, as required.

The lower interface film 11 and the upper interface film 13 are provided in contact with the recording film 12 for the purpose of promoting crystallization of the recording film 12 and enhancing the erasing performance, preventing mutual diffusion of atoms and molecules between the recording film 12 and the lower dielectric film 10 and/or the upper dielectric film 14, and enhancing the durability in repeated recording operations. It also adds to environmental reliability such as prevention of peeling or corrosion in the recording film 12. The material of the lower interface film 11 and the upper interface film 13 may be properly selected from the materials for the lower dielectric film 10 and the upper dielectric film 14 mentioned above. For example, nitrides of Ge and Si, oxides of Ti, Zr, Hf, V, Nb, Ta, Cr, Mo, W and Si, or their composite oxides may be used, and above all, in particular, materials based on oxides of Ti, Zr, Hf, V, Nb and Ta with additional oxides of Cr, Mo and W are excellent in humidity resistance, and the erasing rate is further enhanced by adding an oxide of Si. The thicknesses of the lower interface film 11 and the upper interface film 13 are not particularly specified, but the effect as interface film is lost if too thin or the recording sensitivity is lowered if too thick, and hence it is preferred to be in a range of 0.2 nm or more to 20 nm or less. If either one of the lower interface film 11 and the upper interface film 13 may be provided, similar effects may be obtained, but both should be provided preferably, and, as required, they may be made of different materials and compositions, or same materials and compositions. When the upper interface film 13 is provided, the lower dielectric film 14 may be omitted, and in such a case the thickness of the upper interface film 13 should be 2 nm or more to 50 nm or less.

The recording film 3 is roughly classified into the programmable type and write-once type. The programmable type recording film 3 is made of phase change recording material, that is, a material mainly composed of chalcogens such as Te and/or Sb. In particular, a material mixing compounds of GeTe and $Sb_2Te_3$ at a proper rate is fast in crystallization speed and high in transmissivity, and the recording/reproducing characteristic can be maintained if the film thickness is reduced. This material may have part of Ge replaced by Sn or part of Sb by Bi in order to increase the crystallization speed further, and it is preferred to use a composition expressed in a general formula $(Ge_xSn_{1-x})_z(Sb_yBi_{1-y})_2Te_{z+3}$ (where $0.5 < x \leq 1$, $0 \leq y \leq 1$, $z \geq 1$). By defining $z \geq 1$, the reflectivity and reflectivity change may be increased. In such material composition, in order to adjust the crystallization speed, thermal conductivity, or optical constant, or enhance the repeated durability, heat resistance, or environmental reliability, various elements may be properly added, such as In, Ga, Zn, Cu, Ag, Au, Cr or other additional Ge, Sn, Sb, Bi, Te other metal, semimetal, semiconductor element, or O, N, F, C, S, B or other nonmetallic element, and any one or plural elements selected from them may be added in a range within 10 at %, more preferably within 5 at % of the entire content of the recording film 12.

The thickness of the programmable type recording film 12 is 2 nm or more to 20 nm or less, more preferably 4 nm or more to 14 nm or less, so that a sufficient C/N ratio may be obtained. If the recording film 12 is too thin, sufficient reflectivity and reflectivity change cannot be obtained and the C/N ratio is low, or if too thick, heat diffusion in the thin film plane of the recording film 12 is large, and the C/N ratio is lowered in high density recording.

Such programmable type phase change recording material is amorphous in film formed state, and when recording information signals, it is annealed by laser beam or the like to be crystallized as initializing process, and an amorphous mark is generally formed in this initial state.

The write-once type recording film 3 is made of inorganic material such as phase change recording material based on a metal of relatively low melting point such as Te, Sb, Bi, Sn, In or Ga, or metal oxide, or an organic material such as pigment. In particular, a material based on oxide of Te is applicable in irreversible crystallizing recording, and is suited as write-once type recording film, and is suited as recording film used in semitransparent information layer because high transmissivity can be easily realized. What is particularly preferred is a material mainly composed of Te, O and M (where M is one or more elements selected from the group consisting of Al, Si, Ti, V, Cr, Mn, Fe, Co, Ni, Cu, Zn, Ga, Ge, Zr, Nb, Mo, Ru, Rh, Pd, Ag, In, Sn, Sb, Hf, Ta, W, Re, Os, Ir, Pt, Au and Bi). The most preferred element M is Pd and Au, and by adding them, the crystallization speed is enhanced, and a high environmental reliability is assured.

This material is preferred to have a composition comprising O atom by 25 at % or more to 60 at % or less, and M atom by 1 at % or more to 35 at % or less. If the content of O atom is less than 25 at %, the thermal conductivity of the recording layer is too high, and the recording mark may be excessive. Accordingly, if the recording power is raised, it is hard to raise the C/N ratio. By contrast, if the O atom exceeds 60 at %, the thermal conductivity of the recording layer is too low, and the recording mark may not be increased sufficiently by raising the recording power. As a result, it is hard to realize high C/N ratio and high recording sensitivity. On the other hand, if the content of M atom is less than 1 at %, the action of promoting crystal growth of Te at the time of laser beam irradiation becomes relatively small, and the crystallization speed of the recording film 12 may be insufficient. Hence, the mark may not be formed at high speed. By contrast, if the M atom exceeds 35 at %, the reflectivity change between amorphous and crystal state becomes smaller, and the C/N ratio may be lowered. Such material composition may further include, for the purpose of adjusting the thermal conductivity or optical constant, or enhancing the heat resistance or environmental reliability, one or plural elements selected from nonmetal elements such as N, F, C, S, B and others, as required, in a composition range within 10 at %, or more preferably within 5 at % of the entire content of the recording film 12.

In such a write-once type phase change recording material, it is general to crystallize and record in initial state of amorphous state right after forming the film, and an initializing process is not needed, but it is preferred to stabilize the initial state by annealing for a specific time at high temperature of about 60° C. to 100° C.

The thickness of write-once type recording film 12 is 2 nm or more to 70 nm or less, more preferably 4 nm or more to 30 nm or less, so that a sufficient C/N ratio may be obtained. If the recording film 12 is too thin, sufficient reflectivity or reflectivity change is not obtained, and the C/N ratio is low, or if too thick, the heat diffusion in the thin in plane of the recording film 12 is large, and the C/N ratio is lowered in high density recording.

The reflection film 15 is provided for the purpose of using the incident light efficiently, and enhancing the cooling speed to make it easier to render amorphous. The material of the reflection film 15 may be metal or alloy, for example, Au, Ag, Cu, Al, Ni, Cr, or alloy materials thereof. In particular, the Ag alloy is high in heat conductivity and reflectivity, and Al alloy is also preferred from the viewpoint of cost. The reflection film 15 may be formed by combining a plurality of layers.

The transmissivity adjusting film 16 is provided for the purpose of enhancing the transmissivity while keeping high the reflectivity change of the first information layer. The material of the transmissivity adjusting film 16 is desired to be a transparent material with high refractive index, including, for example, $TiO_2$, $Bi_2O_3$, $Nb_2O_5$, $ZrO_2$, $HfO_2$, $Ta_2O_5$, or mixture thereof. In particular, a material mainly composed of $TiO_2$ is most preferred because the reflective index is as high as 2.7.

The multilayer thin film can be investigated of its material and composition of each layer by Auger electron spectroscopy, X-ray photoelectron spectroscopy, secondary ion mass spectroscopy, or other method (see, for example, Thin film fabrication handbook of Society of Applied Physics, edited by Thin film and surface physics subcommittee, Kyoritsu Publishing, 1991). In the embodiment of the present invention, it has been confirmed that the target material composition of each layer is confirmed to be nearly same as the composition of the thin film formed actually. However, depending on the film forming apparatus, film forming condition or target manufacturing method, the target material composition may be different from the composition of the actually formed thin film. In such a case, it is preferred to determine the correction coefficient for correcting the deviation of composition preliminarily from the empirical rule, and obtain the target material composition so as to obtain the thin film of desired composition.

The material of the protective substrate 3 may be same as the material of the transparent substrate 1 or may be different from the material of the transparent substrate 1, and it may not always be transparent at the wavelength of laser beam 5. The thickness of the protective substrate 3 is not particularly specified, but may be about 0.01 to 3.0 mm.

The separation layer 7 may be made of ultraviolet curing resin or the like. The thickness of the separation layer 12 is required to be at least more than the depth of focus determined by the numerical aperture NA of the objective lens and the wavelength λ of laser beam 5 so that cross-talk from other side may be smaller when reproducing either one of the adjacent information layers, and also enough to settle all information layers within a focusing range. For example, the thickness of the separation layer 7 should be 10 μm or more to 100 μm or less in the case of λ=660 nm and NA=0.6, or 5 μm or more to 50 μm or less in the case of λ=405 nm and NA=0.85. However, if an optical system capable of reducing the interlayer cross-talk is developed, the thickness of the separation layer 7 may be further reduced.

The second information layer 8 and n-th information layer 9 may be any one of programmable type, write-once type, and read-only type information layers. Further, when two optical information recording media are adhered with each protective substrate 3 facing outside to form a two-sided structure, the quantity of information to be accumulated per medium may be doubled.

Each thin film can be formed by, for example, vacuum evaporation method, sputtering method, ion plating method, CVD (Chemical Vapor Deposition) method, MBE (Molecular Beam Epitaxial) method, and other vapor phase thin film deposition method. In particular, the sputtering method is practical and preferred from the viewpoint of film forming speed and equipment cost. In the sputtering method, as mentioned above, the substrate and the target or the film material are positioned face to face, and the film is formed, and at this time, for example, by adjusting the distance of the substrate and target, the difference in film thickness of slope portions of the inner circumferential side and outer circumferential side of the groove 4 can be decreased in the entire region of the disc, and such film forming condition exists as disclosed by the experiments by the present inventors. Further, the radial position of concentric erosion occurring on the target surface when sputtering can be changed by adjusting the position of magnetic field generated from the magnet disposed beneath the target, and thereby it is possible to control the film thickness of the slope portion. By these methods, too, same as in the method of adjusting the distance of substrate and target, the inventors discovered by experiments that there is a film forming condition for decreasing the difference in film thickness of slope portions of the inner circumferential side and outer circumferential side of the groove 4 in the entire region of the disc. The film can be also formed by changing over the erosion position at arbitrary timing sharing between plural radial positions, and the film thickness of the slope portion can be controlled more precisely and at higher degree of freedom.

Each information layer and separation layer 7 may be sequentially formed on the transparent substrate 1, and then the protective substrate 3 may be formed or adhered, or, to the contrary, may be sequentially formed first on the protective substrate 3, and then the transparent substrate 1 may be formed or adhered. The latter process is particularly suited in the case of a thin transparent substrate 1 of 0.3 mm or less. In this case, the groove for guiding laser beam and undulation pattern for address signal must be formed on the surface of the protective substrate 3 and separation layer 7, that is, transferred from a stamper or the like preliminarily forming desired undulation pattern. At this time, in the case of thin layer such as separation layer 7, if ordinary injection method is difficult, it may be formed by photo-polymerization method.

(Manufacturing Apparatus)

Figure 9:
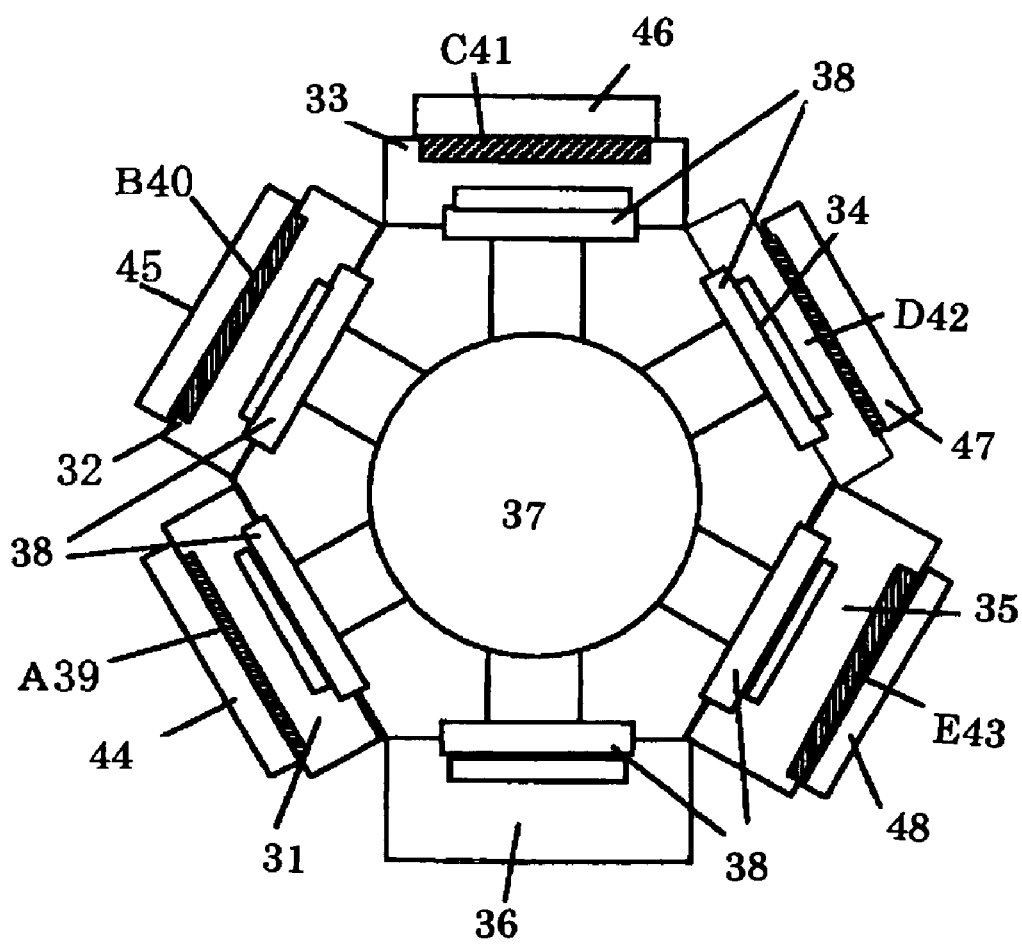
FIG. 9 is a block diagram showing an example of a manufacturing apparatus used in manufacture of the optical information recording medium of the present invention.

The following method and apparatus may be employed as the method and apparatus for eliminating the film thickness difference in the slope portions of the inner circumferential side and outer circumferential side, in particular. FIG. 9 is a structural diagram showing an example of manufacturing apparatus of optical information recording medium of the present invention. This manufacturing apparatus includes a load lock chamber 36, plural independent film forming chambers 31 to 35, and a rotating element 37 for conveying substrates. Five film forming chambers are shown herein, but the number of the film forming chambers is not particularly specified, and the present invention may be similarly applied in the case of four chambers or six or more chambers.

A film forming chamber 31 is composed of RF electrode 44, permanent magnet (not shown) provided inside the RF electrode 44, target A 39 disposed on the RF electrode 44, substrate holder 38 disposed opposite to the target A 39 across a specified interval, and others.

A film forming chamber 32 is composed of DC electrode 45, permanent magnet (not shown) provided inside the DC electrode 45, target B 40 disposed on the DC electrode 45, substrate holder 38 disposed opposite to the target B 40 across a specified interval, and others.

A film forming chamber 33 is composed of RF electrode 46, permanent magnet (not shown) provided inside the RF electrode 46, target C 41 disposed on the RF electrode 46, substrate holder 38 disposed opposite to the target C 41 across a specified interval, and others.

A film forming chamber 34 is composed of DC electrode 47, permanent magnet (not shown) provided inside the DC electrode 47, target D 42 disposed on the DC electrode 47, substrate holder 38 disposed opposite to the target D 42 across a specified interval, and others.

A film forming chamber 35 is composed of RF electrode 48, permanent magnet (not shown) provided inside the RF electrode 48, target E 43 disposed on the RF electrode 48, substrate holder 38 disposed opposite to the target E 43 across a specified interval, and others.

The film forming chambers 31 to 35 are always kept in vacuum state by using a vacuum pump, and by applying RF power or DC power to the electrodes 44 to 48 while feeding desired sputtering gas, RF sputtering or DC sputtering is conducted. In the electrodes 44 to 48, targets 39 to 43 made of materials corresponding to information layer composition of the optical information recording medium are installed.

The load lock chamber 36 incorporates a vacuum pump and a leak valve, and loads and unloads substrates by transferring the substrate charged from outside from atmospheric pressure to vacuum state, or returning the substrate in vacuum state to the atmospheric pressure.

The plural substrate holders 38 are mounted at equal intervals on the rotating element 37, and the rotating element 37 and all substrate holders 38 are always kept in vacuum state.

A substrate put in the load lock chamber 36 is fixed in any one of the substrate holders 38, and transferred to vacuum state, and the rotating element 37 rotates by a specific angle (60° in this case), and it is sent into the adjacent film forming chamber 31, and a film is formed by using the material of the target A 39. Sequentially, it is sent into the next film forming chamber 32, and a film is formed by using the material of the target B 40, and similarly it is sent into the next film forming chamber 33, and a film is formed by using the material of the target C 41, and it is sent into the next film forming chamber 34, and a film is formed by using the material of the target D 42, finally it is sent into the next film forming chamber 35, and a film is formed by using the material of the target E 43, and finally the substrate is discharged in the load lock chamber 36. In this manner, the film forming process in the film forming chambers 31 to 35, and substrate loading and unloading process in the load lock chamber 36 are simultaneously progressed, and the optical information recording media can be manufactured continuously.

Inside the electrodes beneath the targets, permanent magnets are installed for magnetron sputtering, and the sputtering efficiency is enhanced by trapping the electrons generated in sputtering process by the magnetic field generated on the target surface. By adjusting preliminarily the magnetic field distribution on the target surface properly, that is, by adjusting the layout of permanent magnets, the film thickness in the flat portion from the disc inner circumference to outer circumference, that is, the film thickness distribution can be made uniform.

The electrodes 44 to 48 provided in the film forming chambers 31 to 35 can be replaced with other electrodes having various thicknesses, and by properly changing the distances between the electrodes 44 to 48 and substrate holders 38 disposed opposite to the electrodes 44 to 48, the film thickness of the slope portions at both sides of the groove can be controlled when forming the layers.

In this preferred embodiment, RF sputtering is done by applying RF power to the RF electrodes 44, 46, 48 in the film forming chambers 31, 33, 35. Similarly, in the film forming chambers 32 and 34, DC sputtering is done by applying DC power to the DC electrodes 45 and 47.

Supposing the distances between the DC electrodes 45, 47 and substrate holders 38 in the DC sputtering film forming chambers 32, 34 to be Hd1, Hd2, respectively, and the distances between the RF electrodes 44, 46, 48 and substrate holders 38 in the RF sputtering film forming chambers 31, 33, 35 to be Hr1, Hr2, Hr3, respectively, it is set to be Hd1≠Hd2, so that one of distances Hd1, Hd2 may be different from other distance in the DC sputtering film forming chambers.

In this configuration, in DC sputtering, both substrate damage countermeasure and film thickness uniform distribution can be realized depending on the film forming characteristics of target materials, so that the manufacturing yield and efficiency of optical information recording media can be enhanced.

Further, any one of distances Hr1, Hr2, Hr3 in the RF sputtering film forming chambers is set different from either one of distances Hd1, Hd2 in the DC sputtering film forming chambers.

In this configuration, in RF sputtering, both substrate damage countermeasure and film thickness uniform distribution can be realized depending on the film forming characteristics of target materials, so that the manufacturing yield and efficiency of optical information recording media can be enhanced.

In the manufacturing apparatus of the present invention, supposing the target diameter in the RF sputtering film forming chambers to be L, preferably, any one of distances Hr1, Hr2, . . . , Hrn should be set to be 0.20 L or more to less than 0.24 L, and other one to be 0.26 L or more to less than 0.30 L.

More specifically, to reduce the difference between the film thickness of the inner circumferential side and film thickness of the outer circumferential side formed on the groove slopes, it is preferred to shorten the distance between the target and substrate, but if the distance is too close, the target life may be shortened depending on the target material and sputtering time, and radiant heat to the substrate is intensified, and the substrate damage is increased. To extend the target life and suppress the substrate damage, any one distance of distances Hr1, Hr2, . . . , Hrn should be 0.26 L or more to less than 0.30 L. If this distance is more than 0.30 L, the difference is increased between the film thickness of the inner circumferential side and film thickness of the outer circumferential side formed on the groove slopes, or if less than 0.26 L, the target life may be shortened depending on the sputtering condition and the substrate damage is increased.

Even if the distance is less than 0.26 L, in the sputtering condition free from problems of target life and substrate damage, to reduce the difference between the film thickness of the inner circumferential side and film thickness of the outer circumferential side formed on the groove slopes, it is preferred to set any one distance of distances Hr1, Hr2, . . . , Hrn at 0.20 L or more to less than 0.24 L. If this distance is more than 0.24 L, it is hard to suppress the difference between the film thickness of the inner circumferential side and film thickness of the outer circumferential side formed on the groove slopes, or if less than 0.20 L, problems of target life and substrate damage are likely to occur.

In the manufacturing apparatus of the present invention, further, supposing the target diameter in the DC sputtering film forming chambers to be L, preferably, any one of distances Hd1, Hd2, . . . , Hdm should be set to be 0.15 L or more to less than 0.19 L, and other one to be 0.21 L or more to less than 0.25 L.

More specifically, targets used in DC sputtering are generally metal materials, and it is easier to shorten the distance between the electrode and substrate holder than in RF sputtering. Same as in RF sputtering, to reduce the difference between the film thickness of the inner circumferential side and film thickness of the outer circumferential side formed on the groove slopes, it is preferred to shorten the distance between the target and substrate, but if the distance is too close, the target life may be shortened depending on the target material and sputtering time, and radiant heat to the substrate is intensified, and the substrate damage is increased. To extend the target life and suppress the substrate damage, any one distance of distances Hd1, Hd2, . . . , Hdm should be 0.21 L or more to less than 0.25 L. If this distance is more than 0.25 L, the difference is increased between the film thickness of the inner circumferential side and film thickness of the outer circumferential side formed on the groove slopes, or if less than 0.21 L, the target life may be shortened depending on the sputtering condition and the substrate damage is increased.

Even if the distance is less than 0.21 L, in the sputtering condition free from problems of target life and substrate damage, to reduce the difference between the film thickness of the inner circumferential side and film thickness of the outer circumferential side formed on the groove slopes, it is preferred to set any one distance of distances Hd1, Hd2, . . . , Hdm at 0.15 L or more to less than 0.19 L. If this distance is more than 0.19 L, it is hard to suppress the difference between the film thickness of the inner circumferential side and film thickness of the outer circumferential side formed on the groove slopes, or if less than 0.15 L, problems of target life and substrate damage are likely to occur.

In the manufacturing apparatus of the present invention, moreover, supposing the target diameter in the RF sputtering film forming chambers to be L, preferably, any one of distances Hr1, Hr2, . . . , Hrn should be set to be different from other distances by 0.5 L or more. If less than 0.5 L, it is hard to suppress the difference between the film thickness of the inner circumferential side and film thickness of the outer circumferential side formed on the groove slopes, and extend the target life and suppress the substrate damage at the same time.

In the manufacturing apparatus of the present invention, still more, supposing the target diameter in the DC sputtering film forming chambers to be L, preferably, any one of distances Hd1, Hd2, . . . , Hdm should be set to be different from other distances by 0.5 L or more. If less than 0.5 L, it is hard to suppress the difference between the film thickness of the inner circumferential side and film thickness of the outer circumferential side formed on the groove slopes, and extend the target life and suppress the substrate damage at the same time.

In the manufacturing apparatus of the present invention, the diameter of the substrate holder is preferred to be set at 0.4 L or more to 0.8 L or less. If less than 0.4 L, the sputtering efficiency (ratio of atoms accumulated on substrate/sputtering atoms) is poor, and if more than 0.8 L, it is hard to make uniform the sputtering film thickness over the entire circumference of the substrate.

In the manufacturing apparatus of the present invention, preferably, the optical information recording medium includes at least first dielectric layer, reflection layer, second dielectric layer, recording layer, and third dielectric layer formed in this sequence on the substrate, and is designed to be recorded and reproduced by a recording/reproducing apparatus having an optical system of laser beam of wavelength of 350 nm or more to 500 nm or less and lens numerical aperture of 0.7 or more.

In the manufacturing apparatus of the present invention, preferably, the optical information recording medium has a plurality of information layers formed on a substrate having concentric convex and concave grooves.

(Recording/Reproducing Apparatus)

Figure 5:
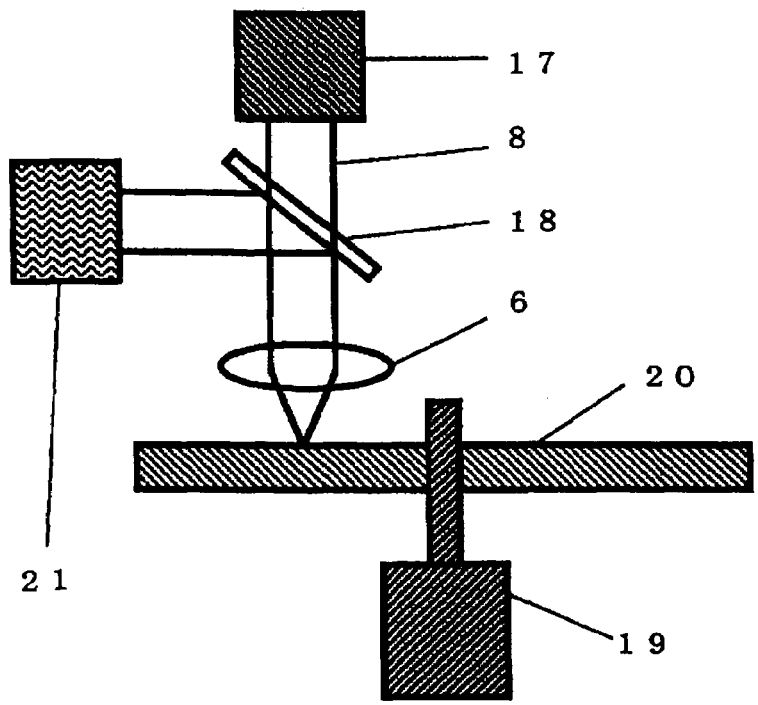
FIG. 5 is a schematic diagram of an example of a recording/reproducing apparatus used for recording/reproducing information on/from the optical information recording medium of the present invention.

FIG. 5 is a schematic diagram of an example of minimum required mechanism of recording/reproducing apparatus used in recording/reproducing of optical information recording medium of the present invention. Leaving a laser diode 17, a laser beam 5 passes through a half-mirror 18 and an objective lens 6, and is focused on an optical information recording medium 20 rotated by a motor 19, and its reflected light is put in a photo detector 21, and a signal is detected. The optical system used in recording/reproducing should have, for example, wavelength of 350 nm or more to 500 nm or less and lens numerical aperture of 0.6 or more so as to be applicable to recording/reproducing of information at high density.

Figure 6:
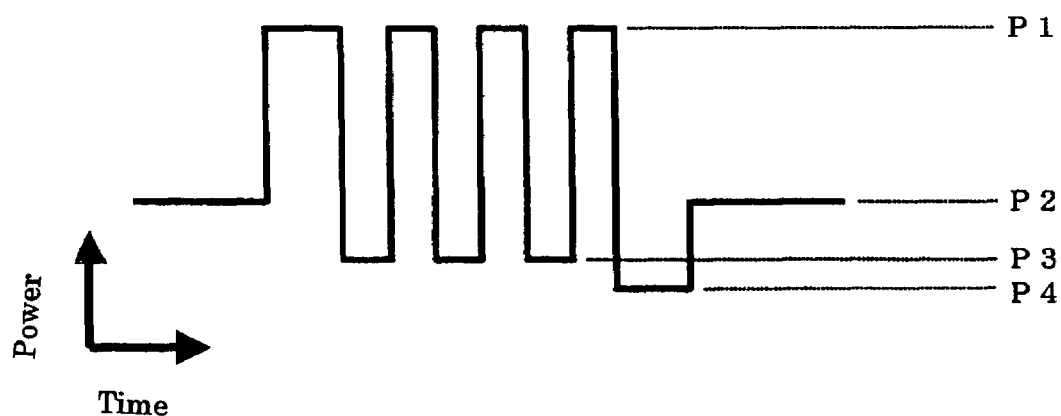
FIG. 6 is a schematic diagram of an example of a pulse waveform used in recording/reproducing of the optical information recording medium of the present invention.

When recording an information signal, the intensity of the laser beam 5 is modulated between plural power levels. To modulate the laser intensity, it is preferred to modulate the driving current of semiconductor laser, or optoelectric modulator, optoacoustic modulator, or other means may be used. In the mark forming area, a single rectangular pulse of peak power P1 may be used, but when forming a particularly long mark, for the purpose of avoiding excessive heat and making the mark width uniform, as shown in FIG. 6, it is preferred to use recording pulse trains composed of plural pulse trains modulated between peak power P1 and bottom power P3 (however, P1>P3). A cooling period of cooling power P4 may be provided after the pulse of the final tail. In the area not forming mark, it is kept constant at bias power P2 (however, P1>P2).

Herein, depending on the length of the mark to be recorded, the length of space before and after it, or other patterns, the mark edge positions may be irregular, and jitter may be increased. In the recording/reproducing method of optical information recording medium of the present invention, in order to prevent such inconvenience and improve the jitter, the position or length of each pulse of the pulse train may be adjusted and compensated so that the edge positions may be aligned in each pattern.

The present invention is further described below while referring to embodiments, but it must be noted that the present invention is not limited by these embodiments alone.

EXAMPLE 1

(Method of Experiment)

Using the manufacturing apparatus shown in FIG. 9, a single layer of target material was formed on a substrate by varying the distance between the electrodes 44 to 48 and substrate holders 38, and the film thicknesses of the inner circumferential side and outer circumferential side of the groove were measured.

All targets A39 to E43 for mounting electrodes 44 to 48 were circular measuring 200 mm in diameter and 6 mm in thickness.

In the film forming chamber 31, $TiO_2$ material was used as target A39, and RF sputtering was performed by supplying RF power of 5 kW to the RF electrode 44 from the RF power source.

In the film forming chamber 32, a material made of $Ag_{0.98}Pd_{0.01}Cu_{0.01}$ was used as target B40, and DC sputtering was performed by supplying DC power of 500 W to the DC electrode 45 from the DC power source.

In the film forming chamber 33, a material made of $(ZrO_2)_{0.25}(SiO_2)_{0.25}(Cr_2O_3)_{0.50}$ was used as target C41, and RF sputtering was performed by supplying RF power of 4 kW to the RF electrode 46 from the RF power source.

In the film forming chamber 34, a material made of $Ge_{0.45}Sb_{0.05}Te_{0.55}$ was used as target D42, and DC sputtering was performed by supplying DC power of 500 W to the DC electrode 47 from the DC power source.

In the film forming chamber 35, a material made of $(ZrO_2)_{0.50}(SiO_2)_{0.50}$ was used as target E43, and RF sputtering was performed by supplying RF power of 4 kW to the RF electrode 48 from the RF power source.

Permanent magnets were installed in the electrodes beneath the targets, and every time the distance between the electrodes 44 to 48 and substrate holders 38 was changed, the layout of the permanent magnets was adjusted, and the film thickness distribution of layers in the initial period of targets was set within ±3%. In sputtering, formation of erosion was confirmed in all targets along the concentric area near the radius of about 60 mm of the target.

In each film forming chamber, Ar gas was used as sputtering gas in all information layers, and films were formed by keeping the gas pressure at 0.2 Pa, and by conveying the substrate holders sequentially into the individual film forming chambers, thin films were formed on the disc substrate, and a polycarbonate sheet was adhered on the surface of the optical disc medium by using an ultraviolet curing resin, and the entire surface of the recording layer was initialized by annealing with a laser beam while rotating the disc substrate.

The film thickness of each information layer of the optical information recording medium was 20 nm in $TiO_2$ layer (dielectric layer), 7 nm in $Ag_{0.98}Pd_{0.91}Cu_{0.01}$ layer (reflection layer), 16 nm in $(ZrO_2)_{0.25}(SiO_2)_{0.25}Cr_2O_3)_{0.50}$ (dielectric layer), 6 nm in $Ge_{0.45}Sb_{0.05}Te_{0.55}$ (recording layer), and 40 nm in $(ZrO_2)_{0.50}(SiO_2)_{0.50}$ (dielectric layer). The optical information recording medium having such layer composition can be used in information recording/reproducing of high density and large capacity by an information recording/reproducing apparatus having an optical system of laser beam of a wavelength of 350 nm or more to 500 nm or less and a lens numerical aperture of 0.7 or more.

According to the integrated target power, the distribution of film thickness formed on the substrate is changed, but by varying the distance between the electrodes 44 to 48 and the substrate holders 38, the mode of change differs, and depending on the target material, uniformity of film thickness distribution may be spoiled in a relatively early period. Therefore, every time the distance between the electrodes 44 to 48 and the substrate holders 38 is changed, the integrated target power is investigated about uniformity of film thickness distribution, and the end of target life is determined when the film thickness distribution of layers exceeds ±3% or more the entire circumference of the disc, and at this time it is evaluated as x when the deflection of target is less than half of the plate thickness, and as ○ when half or more.

The shorter is the distance between the electrodes 44 to 48 and the substrate holders 38, the more likely the substrate is damaged by radiant heat of the target, and the groove formed in the substrate is likely to be deformed depending on the sputtering time, and it is hard to follow up the groove by the laser beam when evaluating the optical disc medium. That is, tracking is difficult. Therefore, when changing the distance of electrode and substrate holder, ease of tracking is investigated in the disc, and it is evaluated as x if failing in tracking, and as ○ if succeeding in tracking.

Every time changing the distance between the electrodes 44 to 48 and substrate holders 38, a single layer of each target material was formed on the substrate, and its section was observed by transmission electron microscope at each radial position, the film thicknesses at the inner circumferential side and the outer circumferential side of the groove were measured as d1 and d2, and the ratio d2/d1 was studied.

To evaluate the recording/reproducing characteristics of the optical information recording medium, in the disc grooves, that is, in the portions being convex forward as seen from the laser beam incident side in the groove and between grooves, 2T signal of mark length of 0.154 μm and 9T signal of mark length of 0.693 μm were recorded by (1-7) modulation system, while rotating at linear speed of 5 m/s, by using an optical system of a wavelength of 405 nm and a lens numerical aperture of 0.85, and the reproducing power was always 0.7 mW.

In unrecorded tracks, 2T signal and 9T signal were recorded alternately in a total of 11 times, and in the 2T signal recorded state, the C/N ratio was measured by a spectrum analyzer. Further by recording 9T signal, the erasure rate, that is, the attenuation ratio of 2T signal amplitude was measured by the same spectrum analyzer. By measuring while arbitrarily changing the power of recording/reproducing, the value of 1.3 times of the power at which the C/N value is lower than the maximum value by 3 dB is determined as recording power, and the central value of the power range in which the erasure rate exceeds 25 dB is set as erasing power, and the noise level at set power of each disc is evaluated.

(Results)

Table 1 shows results of measurement of film thickness ratio d2/d1 of groove slopes in each target material by changing the distance between electrode and substrate holder in each film forming chamber, and noise level of optical disc medium fabricated at same distance between electrode and substrate holder in all film forming chambers.

TABLE 1

| Target material | Radial position (mm) | d2/d1 Distance between and substrate holder | | |
|---|---|---|---|---|
| | | 56 mm | 46 mm | 36 mm |
| Target A | 25 | 1.00 | 0.99 | 1.01 |
| | 40 | 1.05 | 1.03 | 0.98 |
| | 55 | 1.19 | 1.11 | 1.04 |
| Target B | 25 | 1.02 | 1.02 | 1.00 |
| | 40 | 1.05 | 1.02 | 1.00 |
| | 55 | 1.15 | 1.09 | 1.02 |
| Target C | 25 | 1.01 | 0.99 | 0.99 |
| | 40 | 1.06 | 1.02 | 1.00 |
| | 55 | 1.13 | 1.04 | 1.05 |
| Target D | 25 | 1.02 | 1.02 | 1.01 |
| | 40 | 1.09 | 1.06 | 0.99 |
| | 55 | 1.21 | 1.13 | 1.05 |
| Target E | 25 | 1.00 | 1.00 | 1.00 |
| | 40 | 1.06 | 1.05 | 1.01 |
| | 55 | 1.15 | 1.10 | 1.05 |
| Noise level of disc (dBm) | 25 | −60.70 | −60.90 | −60.60 |
| | 40 | −60.30 | −60.40 | −60.50 |
| | 55 | −55.60 | −59.20 | −60.30 |

According to Table 1, in all target materials, the ratio d2/d1 is close to 1 on the inner circumference (radial position: 25 mm) and intermediate circumference (radial position: 40 mm), but the value is larger than 1 on the outer circumference (radial position: 55 mm), and by shortening the distance of electrode and substrate holder, the value of d2/d1 on the outer circumference comes closer to 1. The noise level is higher as the value of d2/d1 is far from 1. Thus, in the optical disc medium having programmable semitransparent information layers, it is known that a favorable signal quality of low noise level is realized by suppressing the film thickness difference between the inner circumferential side and outer circumferential side of the groove slope portions.

Table 2 shows results of evaluation of target life and ease of tracking of disc when the distance of electrode and substrate holder is changed in each film forming chamber. The table also shows the sputtering time of each target for forming the optical disc medium.

TABLE 2

| Target material | Sputtering time (sec) | Evaluation items | Distance between cathode and substrate holder | | |
|---|---|---|---|---|---|
| | | | 56 mm | 46 mm | 36 mm |
| Target A | 15 | Tracking | ○ | ○ | x |
| | | Film thickness distribution | ○ | ○ | ○ |
| Target B | 2 | Tracking | ○ | ○ | ○ |
| | | Film thickness distribution | ○ | ○ | x |
| Target C | 6 | Tracking | ○ | ○ | ○ |
| | | Film thickness distribution | ○ | ○ | x |
| Target D | 3 | Tracking | ○ | ○ | ○ |
| | | Film thickness distribution | ○ | ○ | ○ |
| Target E | 12 | Tracking | ○ | x | x |
| | | Film thickness distribution | ○ | ○ | x |

As known from Table 2, in target A, at the distance of 36 mm between the electrode and the substrate holder, the film thickness distribution is favorable, but tracking is difficult. In targets B and C, at the distance of 36 mm between the electrode and the substrate holder, tracking is excellent, but the film thickness distribution is not favorable. In target D, regardless of distance between the electrode and the substrate holder, at 36 mm, 46 mm or 56 mm, all results are favorable. In target E, at the distance of 46 mm between the electrode and the substrate holder, tracking is difficult, and at 36 mm, both film thickness distribution and tracking were poor.

In the conditions of favorable results, that is, at the distance of 46 mm between the electrode and the substrate holder in targets A, B and C, at distance of 36 mm in target D, and at distance of 56 mm in target E, optical disc media were manufactured, and noise level was studied, and it was −60.8 dB at disc radius of 25 mm, −60.4 dB at 40 mm, and −59.0 dB at 55 mm, and more favorable results were obtained than the noise level (see Table 1) of the discs formed by setting the distance at 56 mm between the electrode and the substrate holder in all target materials.

Thus, supposing the distances between the electrodes 45, 47 and the substrate holders 38 in the DC sputtering film forming chambers 32, 34 to be Hd1 and Hd2, and the distances between the electrodes 44, 46, 48 and the substrate holders 38 in the RF sputtering film forming chambers 31, 33, 35 to be Hr1, Hr2, Hr3, respectively, by setting one distance of distances Hd1, Hd2 in the DC sputtering film forming chambers different from the other, that is, Hd1=46 mm, Hd2=36 mm, substrate damage countermeasure, uniform film thickness distribution, and balance in mass producibility can be achieved depending on the film forming characteristics of target materials.

Further, by setting one of distances Hr1, Hr2, Hr3 in the RF sputtering film forming chambers different from either one of the distances Hd1, Hd2 in the DC sputtering film forming chambers, that is, by setting Hr1=46 mm, Hr2=46 mm, Hr3=56 mm, similarly, substrate damage countermeasure, uniform film thickness distribution, and balance in mass producibility can be achieved depending on the film forming characteristics of target materials.

Concerning relation with the target diameter L, preferably, any one of distances Hr1, Hr1, Hr3 in the RF sputtering film forming chambers 31, 33, 35 should be set at 0.20 L or more to less than 0.24 L, and other one at 0.26 L or more to less than 0.30 L. For example, in the case of target diameter L=200 mm as in this embodiment, one of distances Hr1, Hr2, Hr3 is set in a range of 40 mm to 48 mm, and any other in a range of 52 mm to 60 mm.

Either one of distances Hd1 and Hd2 in the DC sputtering film forming chambers 32, 34 is preferably set at 0.15 L or more to less than 0.19 L, and other at 0.21 L or more to less than 0.25 L. For example, in the case of target diameter L=200 mm as in this embodiment, one of distances Hd1 and Hd2 is set in a range of 30 mm to 38 mm, and other in a range of 42 mm to 50 mm.

Any one of distances Hr1, Hr2, Hr3 in the RF sputtering film forming chambers 31, 33, 35 is preferred to be set different from the other distances by 0.5 L or more. For example, in the case of target diameter L=200 mm as in this embodiment, one of distances Hr1, Hr2, Hr3 is preferred to be set different from the other distances by 100 mm or more.

Either one of distances Hd1 and Hd2 in the DC sputtering film forming chambers 32, 34 is preferably set at different from the other distance by 0.5 L or more. For example, in the case of target diameter L=200 mm as in this embodiment, either one of distances Hd1 and Hd2 is preferred to be set different from the other by 100 mm or more.

The diameter of the substrate holder 38 is preferred to be set at 0.4 L or more to 0.8 L or less. For example, in the case of target diameter L=200 mm as in this example, the diameter of the substrate holder 38 is preferred to be set in a range of 80 mm to 160 mm.

EXAMPLE 2

(Method of Experiment) A protective substrate was made of polycarbonate resin, about 12 cm in diameter, about 1.1 mm in thickness, 0.32 μm in groove pitch, and about 20 nm in groove depth. On the groove side of this protective substrate, a second information layer was formed by laminating a reflection film of Ag98Pd1Cu1 in thickness of 80 nm, a reflection film of Al in thickness of 10 nm, an upper dielectric film of $(ZnS)80(SiO_2)20$ in thickness of 15 nm, an upper interface film of C in thickness of 2 nm, a recording film of Ge45Sb5Te55 in thickness of 10 nm, a lower interface film of $(ZrO_2)25(SiO_2)25(Cr_2O_3)50$ in thickness of 5 nm, and a lower dielectric film of $(ZnS)80(SiO_2)20$ in thickness of 55 nm, sequentially by sputtering method.

On the surface of this second information layer, using an ultraviolet curing resin, a same groove pattern as in protective substrate was transferred by photo-polymerization method, and a separation layer of 25 μm in thickness was formed. On the surface of this separation layer, a first information layer was formed by laminating a transmissivity adjusting layer of $TiO_2$ in thickness of 23 nm, a reflection film of Ag98Pd1Cu1 in thickness of 10 nm, an upper dielectric film of $(ZrO_2)35(SiO_2)35(Cr_2O_3)30$ in thickness of 13 nm, an upper interface film of $(ZrO_2)50(Cr_2O_3)50$ in thickness of 3 nm, a recording film of Ge45Sb5Te55 in thickness of 6 nm, a lower interface film of $(ZrO_2)50(Cr_2O_3)50$ in thickness of 5 nm, and a lower dielectric film of $(ZnS)80(SiO_2)20$ in thickness of 36 nm, sequentially by sputtering method.

On the surface of this first information layer, a sheet of polycarbonate was adhered by using an ultraviolet curing resin, and a transparent substrate in thickness of 75 μm was formed. The entire surface of recording film of each information layer was initialized by annealing with laser beam from the transparent substrate side while rotating this disc.

Each thin film was formed by using a target of 200 mm in diameter and about 6 mm in thickness. The transmissivity adjusting film, dielectric film, and interface film were formed by 2 kW RF power source, the reflection film by 2 kW DC power, and the recording film by 500 W DC power. The sputtering gas was Ar—$N_2$ mixed gas ($N_2$ partial pressure 3%) in the recording film, and Ar gas only in other films, and all films were formed by keeping the gas pressure at 0.2 Pa.

To control the film thickness in the slope portions at the inner and outer circumferential sides of the groove when forming the layers, discs A, B, and C shown in Table 3 were fabricated by varying the distance of target and substrate (T-S distance). At each radial position of disc, its section was observed by transmission electron microscope, the film thicknesses of the first information layer of slope portions at the inner circumferential side and outer circumferential side of the groove were measured as d1 and d2. The ratio d2/d1 is shown in Table 3.

TABLE 3

| Disc (T − S Distance) | Radial position (mm) | d2/d1 | Noise level (dBm) |
|---|---|---|---|
| A (30 mm) | 25 | 1.01 | −60.6 |
| | 40 | 0.99 | −60.5 |
| | 55 | 1.05 | −60.3 |
| B (40 mm) | 25 | 1.02 | −60.9 |
| | 40 | 1.06 | −60.4 |
| | 55 | 1.13 | −59.2 |
| C (50 mm) | 25 | 1.02 | −60.7 |
| | 40 | 1.09 | −60.3 |
| | 55 | 1.21 | −55.6 |

In the grooves of discs, that is, in the portions being convex forward as seen from the laser beam incident side in the groove and between grooves, 2T signal of mark length of 0.154 μm and 9T signal of mark length of 0.693 μm were recorded, while rotating at linear speed of 5 m/s, by using an optical system of a wavelength of 405 nm and a lens numerical aperture of 0.85.

Figure 7:
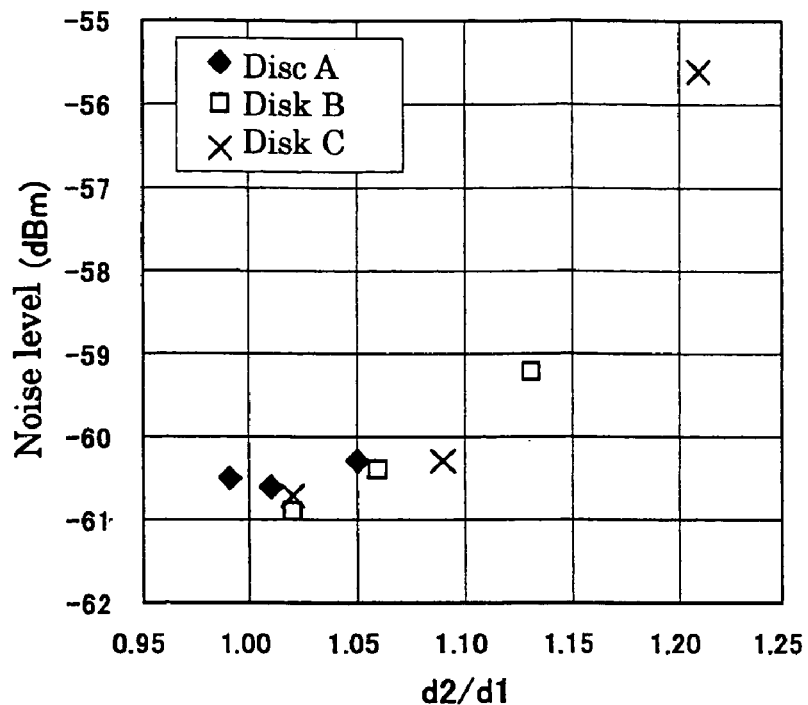
FIG. 7 is a diagram showing dependence of noise level of each disc on the ratio of film thicknesses of slope portions of an inner circumferential side and an outer circumferential side of a groove in Example 2 of the present invention.

When recording signals, a pulse waveform shown in FIG. 6 is used, and in the case of 2T signal, a single pulse of power level P1 and width 6 ns is used, and in the case of 9T signal, it is recorded by using a pulse train consisting of eight pulses of equal intervals of power level P1 and width 6 ns and width between pulses of 9 ns and a subsequent cooling pulse of power level P4 and width 4 ns. P3 and P4 were 0 mW, and reproduction power was always 0.7 mW. In this condition, in unrecorded tracks, 2T signal and 9T signal were recorded alternately in a total of 11 times, and in the 2T signal recorded state, the C/N ratio was measured by spectrum analyzer. Further by recording 9T signal, the erasure rate, that is, the attenuation ratio of 2T signal amplitude was measured by the same spectrum analyzer. By measuring while arbitrarily changing P1 and P2, P1 is determined at the value of 1.3 times of the power at which the amplitude is lower than the maximum value by 3 dB, and P2 is determined at the central value of the power range in which the erasure rate exceeds 25 dB. In any disc, the power setting is P1 of 10.0 mW and P2 of 3.5 mW in the first information layer, and P1 of 10.0 mW and P2 of 4.0 mW in the second information layer. When the carrier level and noise level were compared at the time of measurement of C/N ratio of 2T signal at the power set in each disc, there was almost no difference in the carrier level, but the noise level was significantly different. The noise level is shown in Table 3. The relation of d2/d1 and noise level is shown in FIG. 7.

(Results)

According to Table 3, in any disc, the ratio d2/d1 is close to 1 on the inner circumference (radial position: 25 mm) and intermediate circumference (radial position: 40 mm), but the value is larger than 1 on the outer circumference (radial position: 55 mm). However, by shortening the T-S distance, the value of d2/d1 on the outer circumference comes closer to 1. The noise level is higher as the value of d2/d1 is far from 1, and according to FIG. 7, it is worsened suddenly when the value of d2/d1 exceeds 1.1.

Thus, in the recording medium having programmable semitransparent information layers, it is known that a favorable signal quality of low noise level is realized by suppressing the film thickness difference between the inner circumferential side and outer circumferential side of the groove slope portions within ±10%.

In the case of these discs, the position of concentric erosion generated on the target surface when forming films was near radius of 30 mm, and exactly in the same condition as in the disc A, films were formed by changing the erosion position to near radius 30 mm in the first 30% of film forming time of each layer, and to near radius 55 mm in the remaining 70%. The disc was evaluated same as the disc A, and the value of d12/d1 was 0.9 or more to 1.1 or less at any one of the inner circumference (radial position: 25 mm), intermediate circumference (radial position: 40 mm), and outer circumference (radial position: 55 mm), and the noise level was suppressed below −60 dBm. Thus, by controlling the erosion position, similarly, the difference in film thickness between the inner circumference and outer circumference of slope positions of the groove can be suppressed within ±10%, and it is known that a favorable signal quality of low noise level can be realized.

EXAMPLE 3

(Method of Experiment)

A protective substrate was made of polycarbonate resin, about 12 cm in diameter, about 1.1 mm in thickness, 0.32 μm in groove pitch, and about 20 nm in groove depth. On the groove side of this protective substrate, a second information layer was formed by laminating a reflection film of Ag98Cr2 in thickness of 40 nm, an upper dielectric film of (ZnS)80 (SiO$_2$)20 in thickness of 15 nm, a recording film of Te—O—Pd in thickness of 15 nm, and a lower dielectric film of (ZnS)80(SiO$_2$)20 in thickness of 15 nm, sequentially by sputtering method.

On the surface of this second information layer, using an ultraviolet curing resin, a same groove pattern as in protective substrate was transferred by photo-polymerization method, and a separation layer of about 25 μm in thickness was formed. On the surface of this separation layer, a first information layer was formed by laminating a reflection film of Ag98Pd1Cu1 in thickness of 10 nm, an upper dielectric film of (ZrO$_2$)25(SiO$_2$)25(Cr$_2$O$_3$)20(LaF$_3$)30 in thickness of 15 nm, a recording film of Te—O—Pd in thickness of 10 nm, and a lower dielectric film of (ZnS)80(SiO$_2$)20 in thickness of 30 nm, sequentially by sputtering method. On the surface of this first information layer, a sheet of polycarbonate was adhered by using an ultraviolet curing resin, and a transparent substrate in thickness of 75 μm was formed. This disc was annealed for 2 hours in a thermostatic oven controlled at 100° C.

Each thin film was formed by using a target of 200 mm in diameter and about 6 mm in thickness. The dielectric film and interface film were formed by 2 kW RF power source, the reflection film by 2 kW DC power, and the recording film by 500 W DC power. The sputtering gas was Ar—O$_2$ mixed gas (O$_2$ partial pressure: 50%) in the recording film, and Ar gas only in other films, and all films were formed by keeping the gas pressure at 0.2 Pa. Herein, the Te—O—Pd recording films of the first information layer and second information layer were formed by using Te90Pd10 targets, and the composition ratio was Te:O:Pd=45:50:5 (at %) in both compositions.

To control the film thickness in the slope portions at the both sides of the groove when forming the layers, discs D, E and F shown in Table 4 were fabricated by varying the distance of target and substrate (T-S distance). At each radial position of disc, its section was observed by transmission electron microscope, the film thicknesses of the first information layer of slope portions at the inner circumferential side and outer circumferential side of the groove were measured as d1 and d2. The ratio d2/d1 is shown in Table 4.

TABLE 4

| Disc (T − Distance) | Radial position (mm) | d2/d1 | Noise level (dBm) |
| --- | --- | --- | --- |
| D (30 mm) | 25 | 1.02 | −60.0 |
|  | 40 | 1.00 | −60.6 |
|  | 55 | 1.06 | −60.4 |
| E (40 mm) | 25 | 1.01 | −61.0 |
|  | 40 | 1.02 | −60.6 |
|  | 55 | 1.12 | −59.5 |
| F (50 mm) | 25 | 0.99 | −60.9 |
|  | 40 | 1.05 | −60.7 |
|  | 55 | 1.15 | −58.1 |

In the grooves of discs, that is, in the portions being convex forward as seen from the laser beam incident side in the groove and between grooves, 2T signal of mark length of 0.154 μm was recorded, while rotating at linear speed of 5 m/s, by using an optical system of a wavelength of 405 nm and a lens numerical aperture of 0.85.

When recording signals, a pulse waveform shown in FIG. 6 is used, and a single pulse of power level P1 and width 6 ns are used. P2 was 2 mW, and P3 and P4 were 0 mW, and reproduction power was always 0.7 mW.

Figure 8:
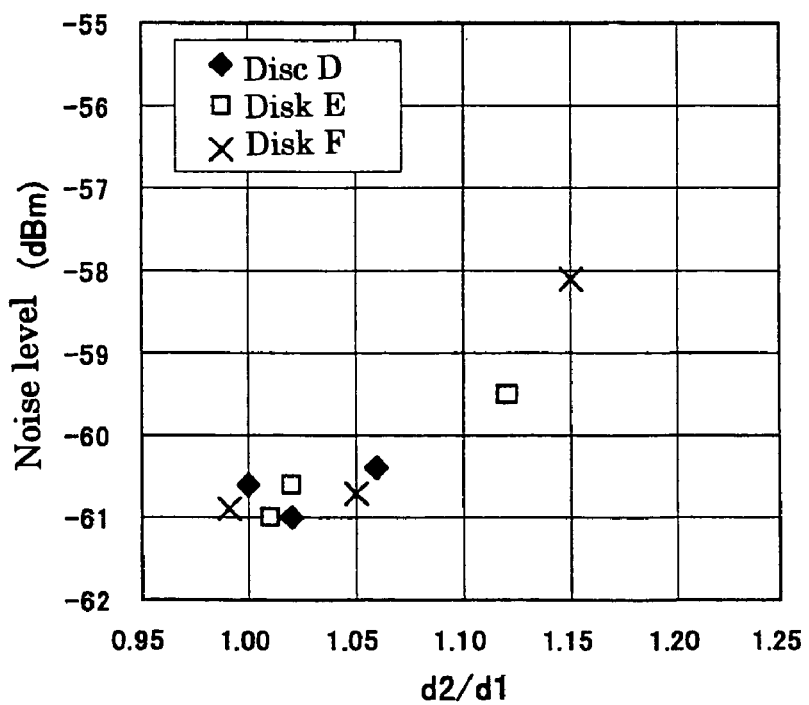
FIG. 8 is a diagram showing dependence of noise level of each disc on the ratio of film thicknesses of slope portions of the inner circumferential side and the outer circumferential side of the groove in Example 3 of the present invention.

In this condition, in unrecorded tracks, 2T signal was recorded once, and the C/N ratio was measured by spectrum analyzer. By measuring while arbitrarily changing P1, the power is set at the value of 1.3 times of the power at which the amplitude is lower than the maximum value by 3 dB. In any disc, the power setting is P1 of 8.5 mW in the first information layer and second information layer. When the carrier level and noise level were compared at the time of measurement of C/N ratio of 2T signal at the power set in each disc, there was almost no difference in the carrier level, but the noise level was significantly different. The noise level is shown in Table 2. The relation of d2/d1 and noise level is shown in FIG. 8.

According to Table 2, in any disc, the ratio d2/d1 is close to 1 on the inner circumference and intermediate circumference, but the value is larger than 1 on the outer circumference. However, by shortening the T-S distance, the value of d2/d1 on the outer circumference decreases and comes closer to 1. The noise level is higher as the value of d2/d1 is far from 1, and according to FIG. 8, it is worsened suddenly when the value of d2/d1 exceeds 1.1.

Thus, in the recording medium having programmable semitransparent information layers, it is known that a favorable signal quality of low noise level is realized by suppressing the film thickness difference between the inner circumferential side and outer circumferential side of the groove slope portions within ±10%.

INDUSTRIAL APPLICABILITY

The optical information recording medium of the invention is useful as a medium for saving electronic data such as video, audio and information.

What is claimed is:

1. An optical information recording medium comprising at least a semitransparent information layer disposed between a circular transparent substrate and a protective substrate, wherein the information layer has spiral grooves for guiding a light beam and, also, includes a recording film capable of recording/reproducing information thereon/therefrom by changing at least in optically detectable two states formed by irradiation of the light beam from the transparent substrate side, and the difference in film thickness of slope portions of the inner circumferential side and the outer circumferential side of the groove in the information layer is within ±10% in the entire region for recording/reproducing information.

2. The optical information recording medium according to claim 1, wherein said information layer is a first information layer, one layer or two or more layers of additional information layers are provided between the first information layer and the protective substrate, and at least one separation layer is disposed between the first information layer and the additional second information layer and also between the additional information layers, respectively, and at least the first information layer out of the plurality of information layers is within ±10% in the difference in film thickness of slope portions of the inner circumferential side and the outer circumferential side of the groove in the information layer in the entire region for recording/reproducing information.

3. The optical information recording medium according to claim 1, wherein said information layer has a first dielectric film at the transparent substrate side of the recording film.

4. The optical information recording medium according to claim 1, wherein said information layer has a first interface film in contact with an interface at the protective substrate side of the recording film.

5. The optical information recording medium according to claim 1, wherein said information layer is a multilayer film having a second dielectric film at the protective substrate side of the recording film.

6. The optical information recording medium according to claim 1, wherein said information layer has a reflection film at the protective substrate side of the recording film.

7. The optical information recording medium according to claim 6, wherein said information layer has a transmissivity adjusting film at the protective substrate side of the reflection film.

8. The optical information recording medium according to claim 3, wherein said information layer has a second interface film in contact with an interface at the transparent substrate side of the recording film.

9. A manufacturing method of an optical information recording medium, comprising: sequentially forming a plurality of information layers having spiral grooves for guiding a light beam on a substrate, in a plurality of film forming chambers having oppositely disposed targets and substrate holders, wherein
the distance between the substrate and film material target in any one film forming chamber out of the plurality of film forming chambers is set different from the distance between the substrate and film material target in the remaining film forming chambers, and thereby the difference in film thickness of slope portions of the inner circumferential side and the outer circumferential side of the groove is within ±10%.

10. The manufacturing apparatus of an optical information recording medium according to claim 9, wherein said optical information recording medium has one layer or two or more layers of additional information layers, disposed between a first information layer as the information layer and a protective substrate, and has separation layers disposed between the first information layer and the additional information layer, and between the respective additional information layers, and
the distance between the substrate and film material target in any one film forming chamber out of the plurality of film forming chambers is set different from the distance between the substrate and film material target in the remaining film forming chambers, thereby forming the first information layer.

11. A manufacturing apparatus of an optical information recording medium having a plurality of information layers formed on a substrate, comprising:
at least two or more DC sputtering film forming chambers, each including an electrode, a magnetic field generating member for generating an electric field in the vicinity of the electrode, a target disposed on the electrode and made of a material corresponding to one information layer, and a substrate holder disposed separately opposite to the target;
at least two or more RF sputtering film forming chambers, each including an electrode, a magnetic field generating member for generating an electric field in the vicinity of the electrode, a target disposed on the electrode and made of a material corresponding to one information layer, and a substrate holder disposed separately opposite to the target; and
a substrate conveying member for moving each substrate holder, conveying the substrate mounted on the substrate holder into each film forming chamber, and forming films sequentially, wherein
the distance between the electrode and the substrate holder in each DC sputtering film forming chamber is respectively Hd1, Hd2, ..., Hdm (where m is the number of DC sputtering film forming chambers),
the distance between the electrode and the substrate holder in each RF sputtering film forming chamber is respectively Hr1, Hr2, ..., Hrn (where n is the number of RF sputtering film forming chambers), and
any one of the distances Hd1, Hd2, ..., Hdm is set different from the other distances.

12. A manufacturing apparatus of an optical information recording medium having a plurality of information layers formed on a substrate, comprising:
at least two or more DC sputtering film forming chambers, each including an electrode, a magnetic field generating member for generating an electric field in the vicinity of the electrode, a target disposed on the electrode and made of a material corresponding to one information layer, and a substrate holder disposed separately opposite to the target;

at least two or more RF sputtering film forming chambers, each including an electrode, a magnetic field generating member for generating an electric field in the vicinity of the electrode, a target disposed on the electrode and made of a material corresponding to one information layer, and a substrate holder disposed separately opposite to the target; and a substrate conveying member for moving each substrate holder, conveying the optical disc substrate mounted on the substrate holder into each film forming chamber, and forming films sequentially, wherein the distance between the electrode and the substrate holder in each DC sputtering film forming chamber is respectively $Hd1, Hd2, \ldots, Hdm$ (where m is the number of DC sputtering film forming chambers), the distance between the electrode and the substrate holder in each RF sputtering film forming chamber is respectively $Hr1, Hr2, \ldots, Hrn$ (where n is the number of RF sputtering film forming chambers), and any one of the distances $Hr1, Hr2, \ldots, Hrn$ is set different from any one of the distances $Hd1, Hd2, \ldots, Hdm$.

13. The manufacturing apparatus of an optical information recording medium according to claim 11, wherein supposing the target diameter in the RF sputtering film forming chambers to be L, any one of the distances $Hr1, Hr2, \ldots, Hrn$ is set to be 0.20 L or more to less than 0.24 L, and other one to be 0.26 L or more to less than 0.30 L.

14. The manufacturing apparatus of an optical information recording medium according to claim 11, wherein supposing the target diameter in the DC sputtering film forming chambers to be L, any one of the distances $Hd1, Hd2, \ldots, Hdm$ is set to be 0.15 L or more to less than 0.19 L, and other one to be 0.21 L or more to less than 0.25 L.

15. The manufacturing apparatus of an optical information recording medium according to claim 11, wherein supposing the target diameter in the RF sputtering film forming chambers to be L, any one of the distances $Hr1, Hr2, \ldots, Hrn$ is set to be different from other distances by 0.5 L or more.

16. The manufacturing apparatus of an optical information recording medium according to claim 11, wherein supposing the target diameter in the DC sputtering film forming chambers to be L, any one of the distances $Hd1, Hd2, \ldots, Hdm$ is set to be different from other distances by 0.5 L or more.

17. The manufacturing apparatus of an optical information recording medium according to claim 13, wherein the diameter of the substrate holder is set at 0.4 L or more to 0.8 L or less.

18. The manufacturing apparatus of an optical information recording medium according to claim 11, wherein said optical information recording medium includes at least a first dielectric layer, a reflection layer, a second dielectric layer, a recording layer and a third dielectric layer formed in this sequence on the substrate, and is designed such that information is recorded thereon/reproduced therefrom by a recording/reproducing apparatus having an optical system of a laser beam of a wavelength of 350 nm or more to 500 nm or less and a lens numerical aperture of 0.7 or more.

19. The manufacturing apparatus of an optical information recording medium according to claim 11, wherein said optical information recording medium has a plurality of information layers formed on a substrate having concentric convex and concave grooves.

20. A recording/reproducing method of an optical information recording medium, comprising: recording/reproducing information on/from an optical information recording medium by using an optical system of a wavelength of 350 nm or more to 500 nm or less and a lens numerical aperture of 0.6 or more, said optical information recording medium comprising at least a semitransparent information layer disposed between a circular transparent substrate and a protective substrate, in which the information layer has spiral grooves for guiding a light beam and, also, includes a recording film capable of recording/reproducing information thereon/therefrom by changing at least in optically detectable two states formed by irradiation of the light beam from the transparent substrate side, and the difference in film thickness of slope portions of the inner circumferential side and the outer circumferential side of the groove is within ±10% in the entire region for recording/reproducing information.

21. The recording/reproducing method of an optical information recording medium according to claim 20, wherein said optical information recording medium has the information layer is a first information layer, and one layer or two or more layers of additional information layers disposed between the first information layer and a protective substrate, and separation layers are disposed between the first information layer and the additional second information layer, and between the respective additional information layers, and at least the first information layer at the transparent substrate side is within ±10% in the difference in film thickness of slope portions of the inner circumferential side and the outer circumferential side of the groove in the entire region for recording/reproducing information.

22. A recording/reproducing apparatus of an optical information recording medium, comprising an optical system of a wavelength of 350 nm or more to 500 nm or less and a lens numerical aperture of 0.6 or more for recording/reproducing information, for an optical information recording medium comprising at least a semitransparent information layer disposed between a circular transparent substrate and a protective substrate, in which the information layer has spiral grooves for guiding a light beam and, also, includes a recording film capable of recording/reproducing information thereon/therefrom by changing at least in optically detectable two states formed by irradiation of the light beam from the transparent substrate side, and the difference in film thickness of slope portions of the inner circumferential side and the outer circumferential side of the groove is within ±10% in the entire region for recording/reproducing information.

23. The recording/reproducing apparatus of an optical information recording medium of claim 22, wherein the optical information recording medium has the information layer is a first information layer, and one layer or two or more layers of additional information layers disposed between the first information layer and a protective substrate, and separation layers are disposed between the first information layer and the additional second information layer, and between the respective additional information layers, and at least the first information layer at the transparent substrate side is within ±10% in the difference in film thickness of slope portions of the inner circumferential side and the outer circumferential side of the groove in the entire region for recording/reproducing information.

24. The manufacturing apparatus of an optical information recording medium according to claim 12, wherein supposing the target diameter in the RF sputtering film forming chambers to be L, any one of the distances $Hr1, Hr2, \ldots, Hrn$ is set to be 0.20 L or more to less than 0.24 L, and other one to be 0.26 L or more to less than 0.30 L.

25. The manufacturing apparatus of an optical information recording medium according to claim 12, wherein supposing the target diameter in the DC sputtering film forming chambers to be L, any one of the distances Hd1, Hd2, ..., Hdm is set to be 0.15 L or more to less than 0.19 L, and other one to be 0.21 L or more to less than 0.25 L.

26. The manufacturing apparatus of an optical information recording medium according to claim 12, wherein supposing the target diameter in the RF sputtering film forming chambers to be L, any one of the distances Hr1, Hr2, ..., Hrn is set to be different from other distances by 0.5 L or more.

27. The manufacturing apparatus of an optical information recording medium according to claim 12, wherein supposing the target diameter in the DC sputtering film forming chambers to be L, any one of the distances Hd1, Hd2, ..., Hdm is set to be different from other distances by 0.5 L or more.

* * * * *